United States Patent
Petz et al.

(10) Patent No.: US 9,419,212 B2
(45) Date of Patent: Aug. 16, 2016

(54) BARRIER FILM TECHNIQUES AND CONFIGURATIONS FOR PHASE-CHANGE MEMORY ELEMENTS

(71) Applicant: INTEL CORPORATION, Santa Clara, CA (US)

(72) Inventors: Christopher W. Petz, Boise, ID (US); Yongjun J. Hu, Boise, ID (US); Dale W. Collins, Boise, ID (US); Allen McTeer, Santa Clara, CA (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 14/562,473

(22) Filed: Dec. 5, 2014

(65) Prior Publication Data

US 2016/0163975 A1     Jun. 9, 2016

(51) Int. Cl.
    *H01L 45/00*     (2006.01)
    *H01L 21/02*     (2006.01)
    *H01L 27/24*     (2006.01)
    *H01L 29/66*     (2006.01)

(52) U.S. Cl.
    CPC .......... *H01L 45/06* (2013.01); *H01L 27/2409* (2013.01); *H01L 29/6609* (2013.01); *H01L 45/12* (2013.01); *H01L 45/1233* (2013.01); *H01L 45/1253* (2013.01); *H01L 45/1608* (2013.01)

(58) Field of Classification Search
None
See application file for complete search history.

(56) References Cited

U.S. PATENT DOCUMENTS

| 2006/0073655 A1 | 4/2006 | Dennison |
| 2006/0278900 A1* | 12/2006 | Chang .................. H01L 45/04 257/248 |
| 2009/0321706 A1 | 12/2009 | Happ et al. |
| 2011/0031460 A1* | 2/2011 | Dennison ............ H01L 27/2409 257/3 |
| 2013/0048935 A1* | 2/2013 | Gotti ...................... H01L 45/06 257/2 |
| 2013/0277637 A1 | 10/2013 | Kim |
| 2014/0117303 A1* | 5/2014 | Wang .................... H01L 45/145 257/4 |
| 2014/0217349 A1 | 8/2014 | Hopkins |

FOREIGN PATENT DOCUMENTS

JP     2011-103332 A     5/2011

OTHER PUBLICATIONS

International Search Report and Written Opinion mailed Apr. 22, 2016, issued in corresponding International Application No. PCT/US2015/059338, 14 pages.

* cited by examiner

*Primary Examiner* — Khaja Ahmad
(74) *Attorney, Agent, or Firm* — Schwabe Williamson & Wyatt PC

(57) ABSTRACT

Embodiments of the present disclosure describe barrier film techniques and configurations for phase-change memory elements. In an embodiment, an apparatus includes a plurality of phase-change memory (PCM) elements, wherein individual PCM elements of the plurality of PCM elements include a bottom electrode layer, a select device layer disposed on the bottom electrode layer, a middle electrode layer disposed on the select device layer, a phase-change material layer disposed on the middle electrode layer, a top electrode layer disposed on the phase-change material layer, and a barrier film comprising a group IV transition metal, a group VI transition metal, carbon (C) and nitrogen (N), the barrier film being disposed between the bottom electrode layer and the top electrode layer. Other embodiments may be described and/or claimed.

20 Claims, 6 Drawing Sheets

BARRIER FILM TECHNIQUES AND CONFIGURATIONS FOR PHASE-CHANGE MEMORY ELEMENTS

FIELD

Embodiments of the present disclosure generally relate to the field of integrated circuits, and more particularly, to barrier film techniques and configurations for phase-change memory elements.

BACKGROUND

Phase-change memory (PCM) technology such as multi-stack cross-point PCM is a promising alternative to other non-volatile memory (NVM) technology. Currently chalcogenide materials in PCM elements may be prone to diffusion through surrounding electrodes, which may frustrate composition control of active films.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe barrier film techniques and configurations for phase-change memory elements. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, a state machine, and/or other suitable components that provide the described functionality.

Figure 1:
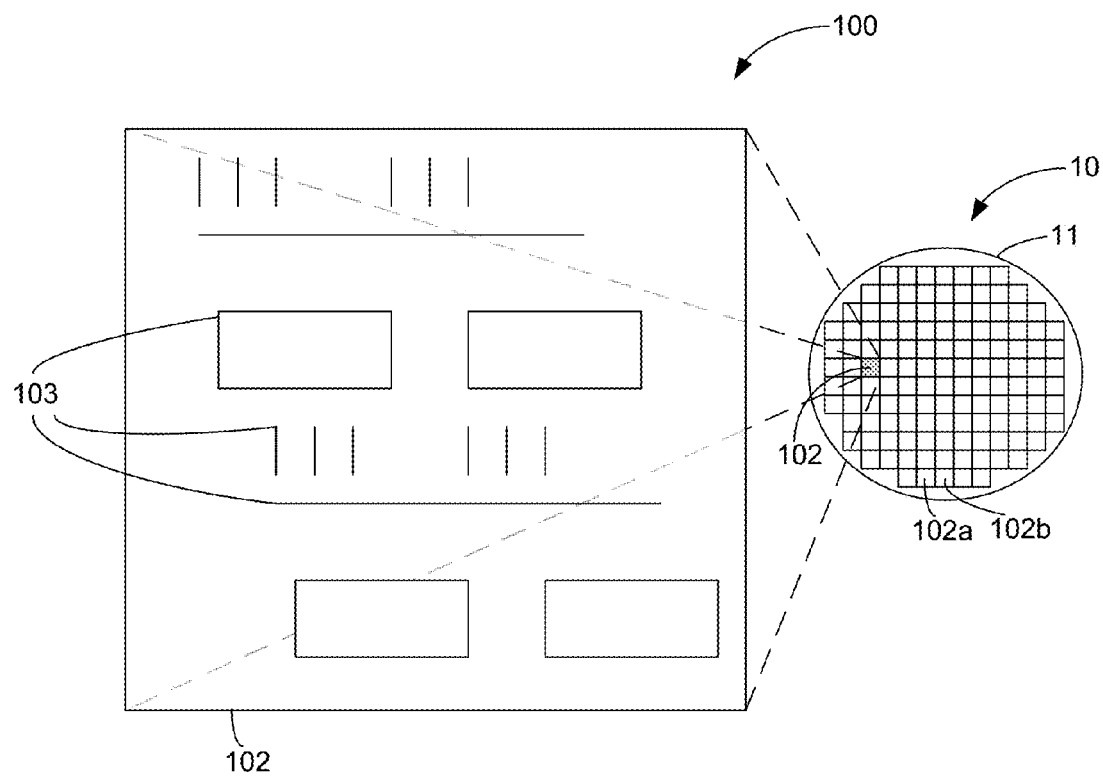
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that includes a phase-change memory (PCM) device as described herein. For example, the die 102 may include circuitry 103 of a PCM device in accordance with some embodiments. According to various embodiments, the circuitry 103 may include one or more PCM elements (e.g., cells), which may be configured in an array. The PCM elements may include, for example, a phase-change material such as a chalcogenide glass that can be switched between crystalline and amorphous states with the application of heat produced by an electric current. The state (e.g., crystalline/amorphous) of the phase-change material may correspond with a logical value (e.g., 1 or 0) of the PCM elements. The circuitry 103 may be part of a PCM and switch (PCMS) device in some embodiments. That is, the PCM elements may include a switch such as, for example, an ovonic threshold switch (OTS) configured for use in selection/programming operations of the PCM elements.

The circuitry 103 may further include one or more bit-lines and one or more word-lines coupled to the PCM elements. The bit-lines and word-lines may be configured such that each of the PCM elements is disposed at an intersection of each individual bit-line and word-line, in some embodiments. A voltage or bias can be applied to a target PCM element of the PCM elements using the word-lines and the bit-lines to select the target cell for a read or write operation. Bit-line drivers may be coupled to the bit-lines and word-line drivers may be coupled to the word-lines to facilitate decoding/selection of the PCM elements. Capacitors and resistors may be coupled to the bit-lines and the word-lines. The circuitry 103 may include other suitable devices and configurations in some embodiments. For example, the circuitry 103 may include one or more modules configured to perform read, program, verify and/or analysis operations.

In some embodiments, the circuitry 103 may be formed using PCM fabrication techniques and/or other suitable semiconductor fabrication techniques. It is noted that the circuitry 103 is only schematically depicted in FIG. 1 and may represent a wide variety of suitable logic or memory in the form of circuitry including, for example, one or more state machines including circuitry and/or instructions in storage (e.g., firmware or software) configured to perform actions such as read, program, verify and/or analysis operations.

After a fabrication process of the semiconductor product is complete, the wafer 11 may undergo a singulation process in which each of the dies (e.g., dies 102, 102a, 102b) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the circuitry 103 may be disposed on a semiconductor substrate in wafer form 10 or singulated form 100. In some embodiments, the die 102 may include logic or memory, or combinations thereof.

Figure 2:
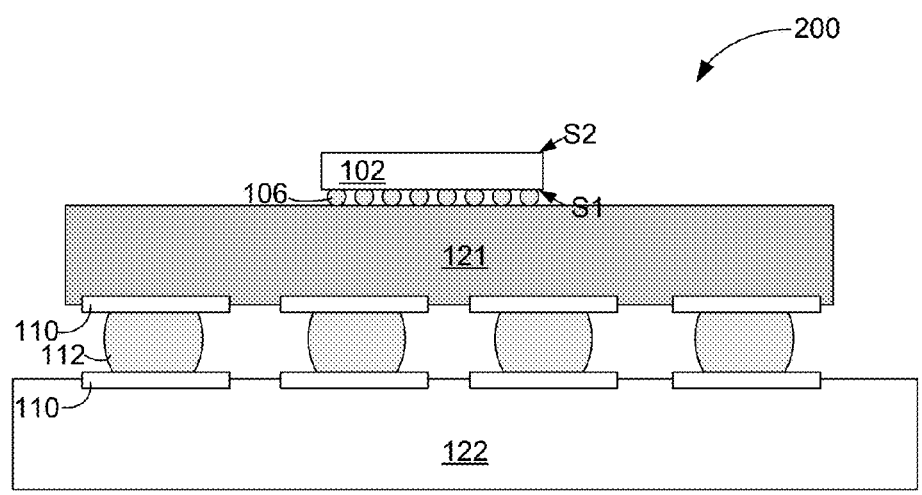
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include circuitry (e.g., circuitry 103 of FIG. 1) such as a PCM device as described herein. In some embodiments, the package substrate 121 may be coupled with a circuit board 122, as can be seen.

The die 102 may represent a discrete product made from a semiconductor material (e.g., silicon) using semiconductor fabrication techniques such as thin film deposition, lithography, etching and the like used in connection with forming PCM devices. In some embodiments, the die 102 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, PCM elements. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 602 of FIG. 6).

Package-level interconnects such as, for example, solder balls 112 may be coupled to pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. The package-level interconnect may include other structures and/or configurations including, for example, land-grid array (LGA) structures and the like.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
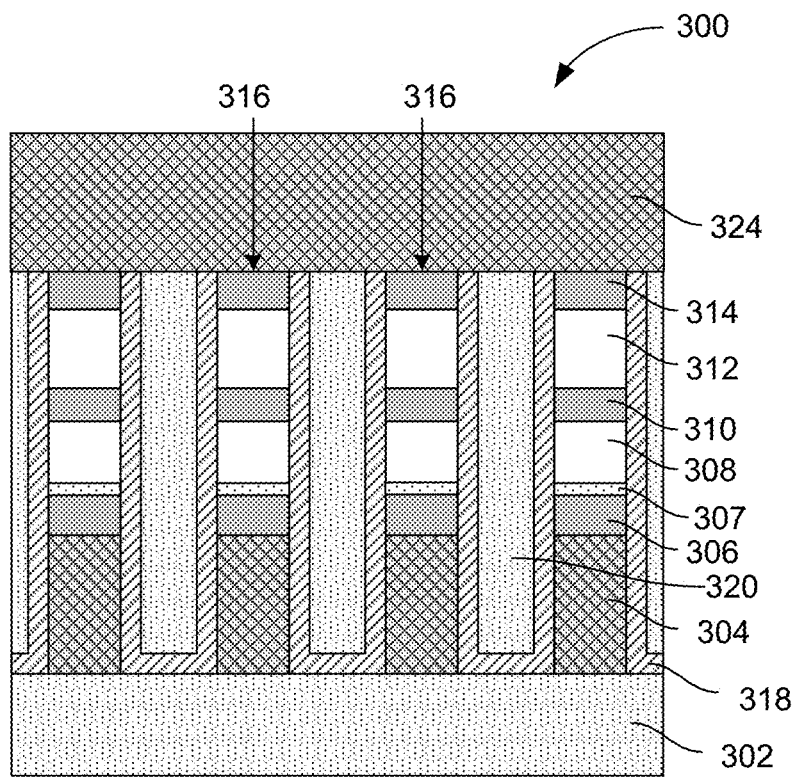
FIG. 3 schematically illustrates a cross-section side view of a PCM device, in accordance with some embodiments.

FIG. 3 schematically illustrates a cross-section side view of a PCM device 300, in accordance with some embodiments. The PCM device may include a plurality of PCM elements (e.g., individual PCM elements 316) formed on a substrate 302. The individual PCM elements 316 may correspond with cells of an array of cells of the PCM device.

According to various embodiments, each of the individual PCM elements 316 may include a stack of layers disposed on a word-line 304. One or more intervening layers and/or structures (e.g., circuitry) may be disposed between the substrate 302 and the word-line 304. For example, the circuitry may include complementary metal-oxide-semiconductor (CMOS) devices and/or metallization that is formed on the substrate 302 between the word-line 304 and the substrate 302. In some embodiments, the circuitry may include a charge pump and/or select circuitry. The substrate 302 may be a semiconductor substrate such as, for example, silicon in some embodiments. The word-line 304 may include, for example, tungsten. Other suitable materials for the substrate 302 and the word-line 304 may be used in other embodiments.

In some embodiments, the individual PCM elements 316 may each include a select device (SD) layer 308 and a phase-change material (PM) layer 312 disposed between electrodes. For example, in the depicted embodiment, the SD layer 308 may be disposed on a bottom electrode layer 306 that may be formed on the word-line 304. A middle electrode layer 310 may be disposed on the SD layer 308. The PM layer 312 may be disposed on the middle electrode layer 310 and a top electrode layer 314 may be disposed on PM layer 312. The individual PCM elements 316 may include other intervening materials and/or layers according to various embodiments.

According to some embodiments, the individual PCM elements 316 may include a barrier film 307 disposed between the bottom electrode layer 306 and the top electrode layer 314. The barrier film 307 may provide chemical isolation for chalcogenide materials (e.g., selenium (Se) or tellurium (Te)) in the individual PCM element 316. In some embodiments, the barrier film 307 may be configured to prevent or reduce diffusion of chalcogenide material from the SD layer 308 and/or the PM layer 312 to the bottom electrode layer 306, the middle electrode layer 310 and/or the top electrode layer 314. For example, in the depicted embodiment, the barrier film 307 is disposed between the SD layer 308 and the bottom electrode layer 306, as can be seen, such that the barrier film 307 may inhibit diffusion of chalcogenide material between the SD layer 308 and the bottom electrode 306. In other embodiments, the barrier film 307 may be disposed between other layers of the stack of layers 306, 308, 310, 312, 314 including, for example, the examples depicted and/or described in connection with FIGS. 4A-E.

The barrier film 307 may be composed of materials that provide a suitable interface between material of the electrode layers 306, 310, 314 and chalcogenide material of the SD layer 308 and/or the PM layer 312. In some embodiments, the barrier film 307 may include a group IV transition metal, a group VI transition metal, carbon (C) and nitrogen (N). The group IV transition metal may include, for example, titanium (Ti), zirconium (Zr), or hafnium (Hf), or suitable combinations thereof. The group VI transition metal may include, for example, chromium (Cr), molybdenum (Mo), tungsten (W), or seaborgium (Sg), or suitable combinations thereof. In one embodiment, the barrier film 307 may be composed of TiWCN. The barrier film 307 may include other suitable combinations of group IV and group VI transition metals with C and N in other embodiments. In some embodiments, the barrier film 307 may be composed of multiple films having a same or different chemical composition.

According to various embodiments, the barrier film 307 may be formed by any suitable deposition technique. For example, in one embodiment, the barrier film may be formed by magnetron sputter deposition of solid constituents (Ti, W, and C) in a reactive sputtering gas mixture of Ar+N2. The gas ratio (Ar/N2) may be tuned from 20-1 Ar/N2. A thin film of desired composition may be obtained by any combination of pure (Ti, W, C) or composite (TiW, TiC, WC, TiWC) targets in a multiple-cathode (co-sputter) physical vapor deposition (PVD) chamber. In other embodiments, TiWCN films may be obtained by superlattice deposition using atomic layer deposition (ALD) techniques. For example, TiWCN films may be achievable by sequential atomic layer deposition of TiN+WN+C. Other suitable deposition techniques may be used in other embodiments.

Resistivity, structure and/or barrier properties of the barrier film 307 may be tuned through modulation of relative content of the group IV transition metal, group VI transition metal, carbon (C) and nitrogen (N). For example, in an embodiment where the barrier film 307 is composed of a TiWCN lamina, modulation of Ti and/or W in the range from 0-15% by atom of W and from 0-75% by atom of Ti may be used, according to some embodiments, to tune the properties of the barrier film 307. N content in the barrier film 307 may depend on a stoichiometry of reactively sputtered metals and may be between 20%-35% by atom in some embodiments. A composition of C in the barrier film 307 may range from 5%-90% by atom in some embodiments. Increasing a composition of C and N in the barrier film 307 may provide an amorphous structure as deposited and may retain amorphous structure even after thermal treatment (e.g., at 600° C.).

The use of W in the barrier film 307 may increase the density of the interfacial layer relative to bulk material of the electrode layers 306, 310, 314, which may result in improved barrier quality. In some embodiments, precipitation of Ti—C and W—C inclusions within the barrier film 307 may form at an interface with the electrode layers 306, 310, 314, which may improve thermal stability.

In some embodiments, the barrier film 307 may have a resistance ranging from 1 milli-Ohm·cm (mOhm·cm) to 50 mOhm·cm and a thickness ranging from 15 Angstrom (A) to 50 A. The barrier film 307 may have other suitable resistance and/or thickness in other embodiments.

According to various embodiments, the electrode layers 306, 310 and 314 may be composed of carbon (C). The electrode layers 306, 310 and 314 may be tuned for resistivity, smoothness, and C-bonding (sp2 or sp3). In some embodiments, the electrode layers 306, 310 and/or 314 may be composed of one or more conductive and/or semiconductive materials having a resistivity ranging from 1 milli-Ohm·centimeter (mOhm·cm) to 100 mOhm·cm such as, for example, carbon (C), carbon nitride ($C_xN_y$); n-doped polysilicon and p-doped polysilicon; metals including Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; and conductive metal oxides including $RuO_2$.

According to various embodiments, the PM layer 312 may be composed of a phase-change material such as a chalcogenide glass that can be switched between crystalline and amorphous states with the application of heat produced by an electric current such as an alloy including at least two of the elements among germanium, antimony, tellurium, silicon, indium, selenium, sulphur, nitrogen and carbon.

According to various embodiments, the SD layer 308 may include a P-N diode, an MIEC (Mixed Ionic Electronic Conduction) device or an OTS (Ovonic Threshold Switch) based on chalcogenide alloys with composition including any one of the chalcogenide alloy systems described for the storage element (e.g., the PM layer 312) and, in addition, may further include an element that can suppress crystallization. The layers 306, 308, 310, 312 and 314 may be composed of other suitable materials having other suitable properties in other embodiments.

The PCM device 300 may further include a dielectric liner 318 conformally deposited on surfaces of the stack of layers of the individual PCM elements 316, as can be seen. A dielectric fill material 320 may be deposited on the dielectric liner 318 to fill the region between the individual PCM elements 316 using any suitable technique. In some embodiments, the dielectric liner 318 may be composed of silicon nitride ($Si_3N_4$ or in general $Si_xN_y$, where x and y represent any suitable relative quantity) and the dielectric fill material 320 may be composed of silicon oxide ($SiO_2$). The dielectric liner 318 and the dielectric fill material 320 may be composed of other suitable materials in other embodiments.

The PCM device 300 may further include a bit-line 324 coupled with the individual PCM elements 316, as can be seen. In some embodiments, the bit-line 324 may be electrically and/or directly coupled with the top electrode 314. The bit-line metal 324 may be composed of any suitable metal including, for example, tungsten and may be deposited using any suitable technique.

FIGS. 4A-E schematically illustrate cross-section side views of a PCM element having a barrier film 307 disposed between a bottom electrode layer 306 and a top electrode layer 314, in accordance with some embodiments. Each of the PCM elements 416A-E of respective FIGS. 4A-E may comport with embodiments described in connection with individual PCM elements 316 of FIG. 3 and vice versa.

Figure 4A:
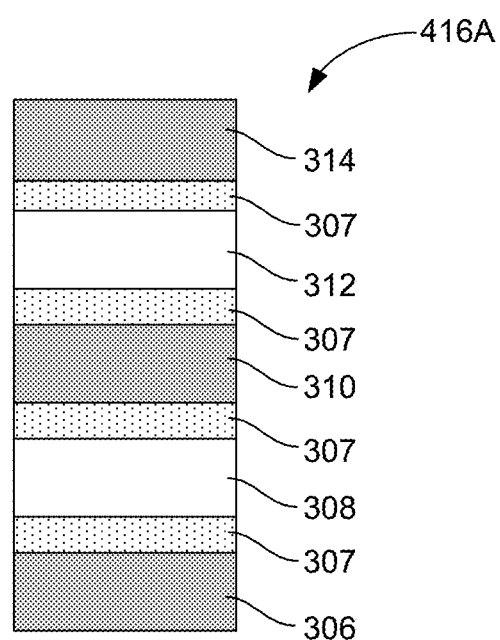
FIGS. 4A-E schematically illustrate cross-section side views of a PCM element having a barrier film disposed between a bottom electrode layer and a top electrode layer, in accordance with some embodiments.

Referring to the PCM element 416A of FIG. 4A, each of the SD layer 308 and the PM layer 312 are disposed between respective barrier films 307. A barrier film 307 is disposed at an interface between the SD layer 308 and the bottom electrode layer 306 and between the SD layer 308 and the middle electrode 310, as can be seen. Further, a barrier film 307 is disposed at an interface between the PM layer 312 and the middle electrode layer 310 and between the PM layer 312 and the top electrode 314, as can be seen.

Figure 4B:
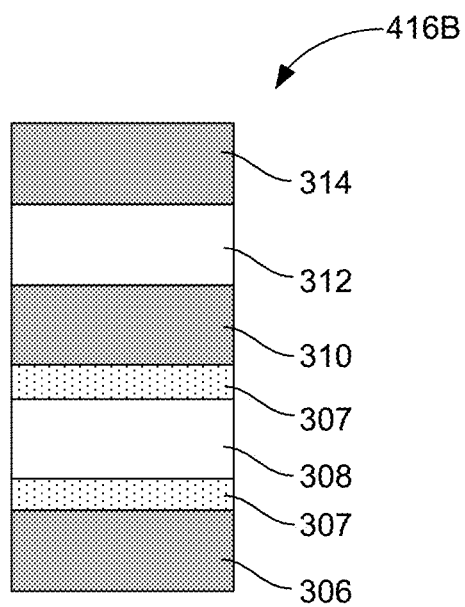

Referring to the PCM element 4168 of FIG. 4B, the SD layer 308 is disposed between barrier films 307. A barrier film 307 is disposed at an interface between the SD layer 308 and the bottom electrode layer 306 and between the SD layer 308 and the middle electrode 310, as can be seen.

Figure 4C:
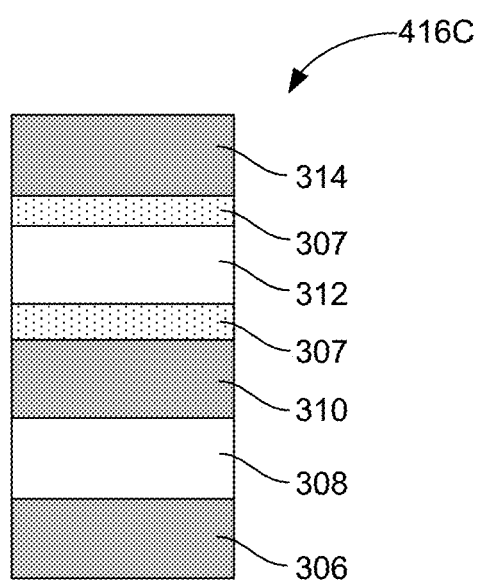

Referring to the PCM element 416C of FIG. 4C, the PM layer 312 is disposed between barrier films 307. A barrier film 307 is disposed at an interface between the PM layer 312 and the middle electrode layer 310 and between the PM layer 312 and the top electrode 314, as can be seen.

Figure 4D:
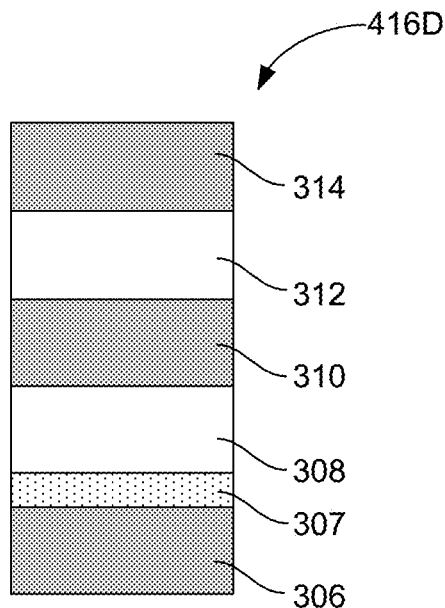

Referring to the PCM element 416D of FIG. 4D, a barrier film 307 is disposed at an interface between the SD layer 308 and the bottom electrode 306.

Figure 4E:
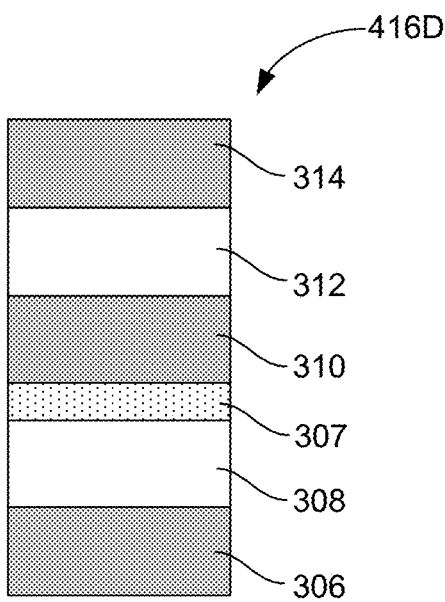

Referring to the PCM element 416E of FIG. 4E, a barrier film 307 is disposed at an interface between the SD layer 308 and the middle electrode 310.

The barrier film 307 may be disposed between the bottom electrode 306 and the top electrode 314 in other configurations than depicted in other embodiments. For example, in some embodiments, the barrier film 307 may be disposed at an interface between the PM layer 312 and the middle electrode 310 or at an interface between the PM layer 312 and the top electrode 314.

Figure 5:
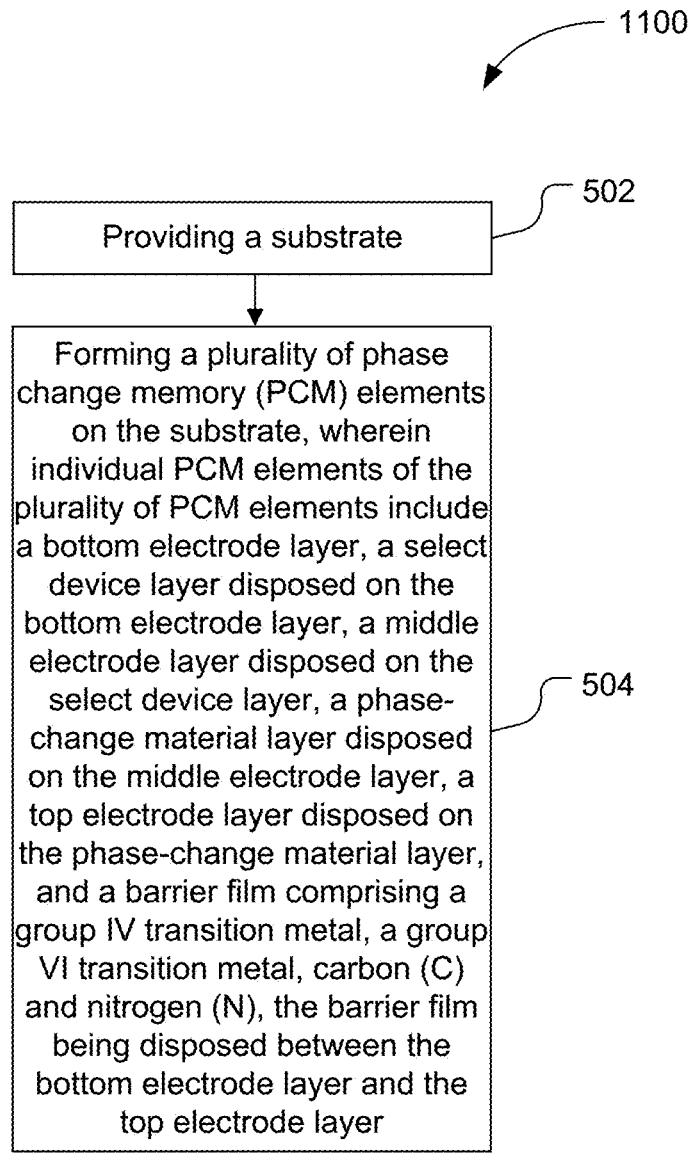
FIG. 5 is a flow diagram of a method of fabricating a PCM device, in accordance with some embodiments.

FIG. 5 is a flow diagram of a method 500 of fabricating a PCM device (e.g., PCM device 300 of FIG. 3), in accordance with some embodiments. The method 500 may comport with embodiments described in connection with FIGS. 1-4 and vice versa.

At 502, the method 500 may include providing a substrate (e.g., substrate 302 of FIG. 3). The substrate may include, for example, a semiconductor substrate such as a silicon wafer or die.

At 504, the method 500 may include forming a plurality of phase-change memory (PCM) elements on the substrate, wherein individual PCM elements (e.g., individual PCM elements 316 of FIG. 3) of the plurality of PCM elements include a bottom electrode layer (e.g., bottom electrode layer 306 of FIG. 3 and FIGS. 4A-E), a select device layer (e.g., SD layer 308 of FIG. 3 and FIGS. 4A-E) disposed on the bottom electrode layer, a middle electrode layer (e.g., middle electrode layer 310 of FIG. 3 and FIGS. 4A-E) disposed on the select device layer, a phase-change material layer (e.g., PM layer 312 of FIG. 3 and FIGS. 4A-E) disposed on the middle electrode layer, a top electrode layer (e.g., top electrode layer 314 of FIG. 3 and FIGS. 4A-E) disposed on the phase-change material layer, and a barrier film (e.g., barrier film 307 of FIG. 3 and FIGS. 4A-E) comprising a group IV transition metal, a group VI transition metal, carbon (C) and nitrogen (N), the barrier film being disposed between the bottom electrode layer and the top electrode layer. According to various embodiments, the barrier film may be arranged according to one of the configurations described and/or depicted in connection with FIG. 3 or one of FIGS. 4A-E. The barrier film may be formed according to techniques described in connection with FIG. 3.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 6:
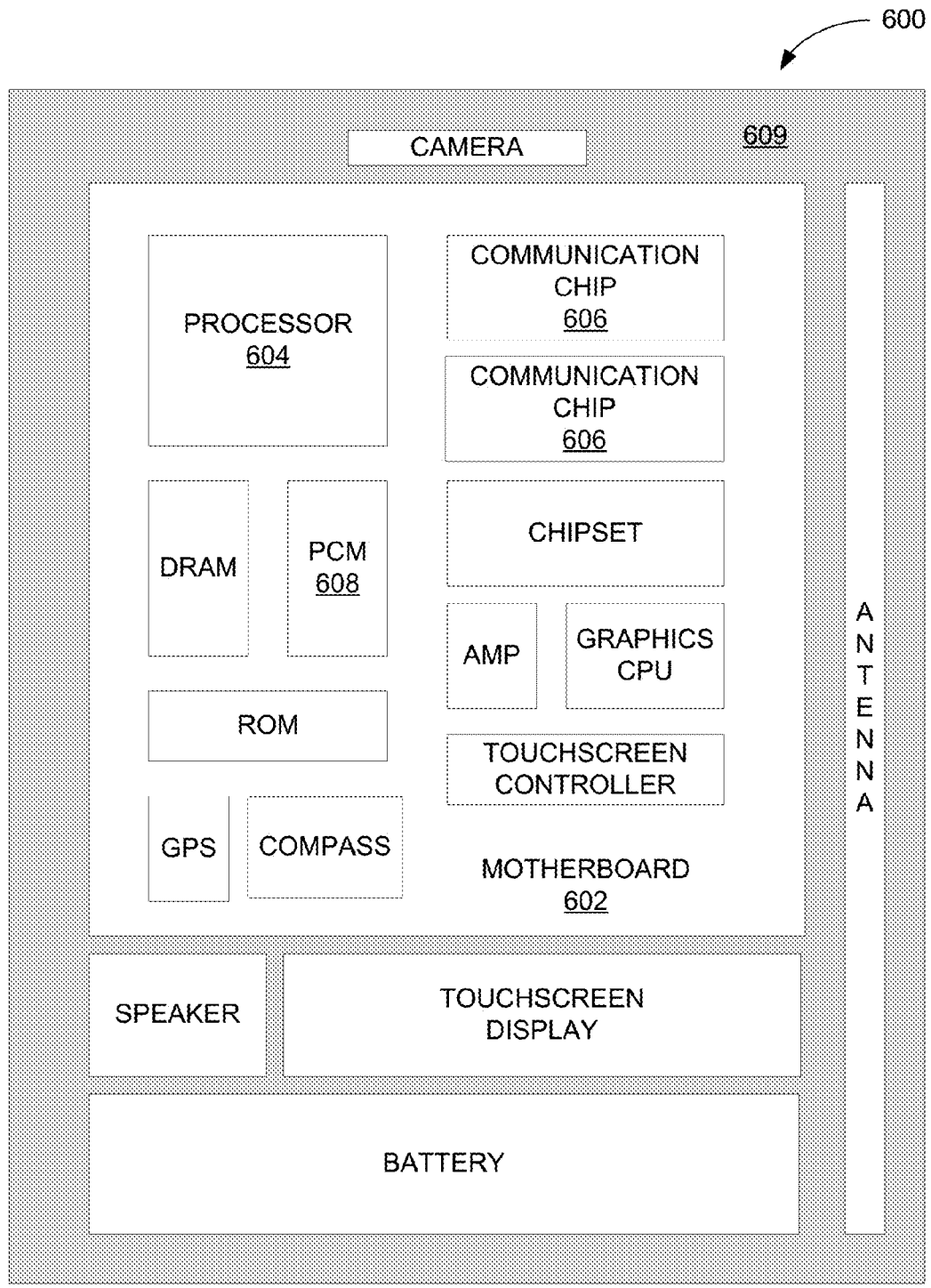
FIG. 6 schematically illustrates an example system that includes a PCM device in accordance with various embodiments described herein.

Embodiments of the present disclosure may be implemented into a system using any suitable hardware and/or software to configure as desired. FIG. 6 schematically illustrates an example system (e.g., computing device 600) that includes a PCM device (e.g., PCM device 300 of FIG. 3), in accordance with various embodiments described herein. The computing device 600 may house (e.g., in housing 609) a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., PCM 608 or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 608 may comport with embodiments described herein. For example, the PCM 608 may include a PCM device (e.g., PCM device 300 of FIG. 3) as described herein.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

According to various embodiments, the present disclosure describes an apparatus. Example 1 of an apparatus may include a plurality of phase-change memory (PCM) elements, wherein individual PCM elements of the plurality of PCM elements include: a bottom electrode layer; a select device layer disposed on the bottom electrode layer; a middle electrode layer disposed on the select device layer; a phase-change material layer disposed on the middle electrode layer; a top electrode layer disposed on the phase-change material layer; and a barrier film comprising a group IV transition metal, a group VI transition metal, carbon (C) and nitrogen (N), the barrier film being disposed between the bottom electrode layer and the top electrode layer. Example 2 may include the apparatus of Example 1, wherein: the group IV transition metal comprises titanium (Ti); and the group VI transition metal comprises tungsten (W). Example 3 may include the apparatus of Example 2, wherein the barrier film comprises up to 15% by atom of Ti and from 20% to 35% by atom of W. Example 4 may include the apparatus of Example 1, wherein: the bottom electrode layer, the middle electrode layer and the top electrode layer comprise carbon; and the select device layer and the phase-change material layer comprise a chalcogenide material. Example 5 may include the apparatus of any of Examples 1-4, wherein the barrier film is disposed at an interface between the bottom electrode layer and the select device layer. Example 6 may include the apparatus of any of Examples 1-4, wherein the barrier film is disposed at an interface between the select device layer and the middle electrode. Example 7 may include the apparatus of any of Examples 1-4, wherein the barrier film is disposed at an interface between the middle electrode layer and the phase-change material layer. Example 8 may include the apparatus of any of Examples 1-4, wherein the barrier film is disposed at an interface between the phase-change material layer and the top electrode layer. Example 9 may include the apparatus of any of Examples 1-4, wherein the barrier film is a first barrier film disposed at an interface between the bottom electrode layer and the select device layer, the apparatus further comprising: a second barrier film disposed at an interface between the select device layer and the middle electrode layer, the second barrier film comprising the group IV transition metal, the group VI transition metal, carbon (C) and nitrogen (N). Example 10 may include the apparatus of any of Examples 1-4, wherein the barrier film is a first barrier film disposed at an interface between the middle electrode layer and the phase-change material layer, the apparatus further comprising: a second barrier film disposed at an interface between the phase-change material layer and the top electrode layer, the second barrier film comprising the group IV transition metal, the group VI transition metal, carbon (C) and nitrogen (N). Example 11 may include the apparatus of any of Examples 1-4, wherein the barrier film is a first barrier film disposed at an interface between the bottom electrode layer and the select device layer, the apparatus further comprising: a second barrier film disposed at an interface between the select device layer and the middle electrode layer, the second barrier film comprising the group IV transition metal, the group VI transition metal, carbon (C) and nitrogen (N); a third barrier film disposed at an interface between the middle electrode layer and the phase-change material layer, the third barrier film comprising the group IV transition metal, the group VI transition metal, carbon (C) and nitrogen (N); and a fourth barrier film disposed at an interface between the phase-change material layer and the top electrode layer, the fourth barrier film comprising the group IV transition metal, the group VI transition metal, carbon (C) and nitrogen (N).

According to various embodiments, the present disclosure describes a method. Example 12 of a method may include providing a substrate; and forming a plurality of phase-change memory (PCM) elements, wherein individual PCM elements of the plurality of PCM elements include: a bottom electrode layer; a select device layer disposed on the bottom electrode layer; a middle electrode layer disposed on the select device layer; a phase-change material layer disposed on the middle electrode layer; a top electrode layer disposed on the phase-change material layer; and a barrier film comprising a group IV transition metal, a group VI transition metal, carbon (C) and nitrogen (N), the barrier film being disposed between the bottom electrode layer and the top electrode layer. Example 13 may include the method of Example 12, wherein forming the plurality of PCM elements comprises: depositing the bottom electrode layer on a word-line disposed on the substrate; depositing the select device layer on the bottom electrode layer; depositing the middle electrode layer on the select device layer; depositing the phase-change material layer on the middle electrode layer; depositing the top electrode layer on the phase-change material layer; and depositing the barrier film on one of the bottom electrode layer, the select device layer, the middle electrode layer, the phase-change material layer, and the top electrode layer. Example 14 may include the method of Example 13, wherein depositing the barrier film is performed by physical vapor deposition (PVD) or atomic layer deposition (ALD). Example 15 may include the method of any of Examples 13-14, wherein: the group IV transition metal comprises titanium (Ti); and the group VI transition metal comprises tungsten (W). Example 16 may include the method of Example 15, wherein the barrier film comprises up to 15% by atom of Ti and from 20% to 35% by atom of W.

According to various embodiments, the present disclosure describes a system (e.g., a computing device). Example 17 of a system may include a circuit board; and a die coupled with the circuit board, the die comprising: a plurality of phase-change memory (PCM) elements, wherein individual PCM elements of the plurality of PCM elements include: a bottom electrode layer; a select device layer disposed on the bottom electrode layer; a middle electrode layer disposed on the select device layer; a phase-change material layer disposed on the middle electrode layer; a top electrode layer disposed on the phase-change material layer; and a barrier film comprising a group IV transition metal, a group VI transition metal, carbon (C) and nitrogen (N), the barrier film being disposed between the bottom electrode layer and the top electrode layer. Example 18 may include the system of Example 17, wherein: the group IV transition metal comprises titanium (Ti); and the group VI transition metal comprises tungsten (W). Example 19 may include the system of Example 17, wherein: the bottom electrode layer, the middle electrode layer and the top electrode layer comprise carbon; and the select device layer and the phase-change material layer comprise a chalcogenide material. Example 20 may include the system of any of Examples 17-19, wherein the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
    a plurality of phase-change memory (PCM) elements, wherein individual PCM elements of the plurality of PCM elements include:
    a bottom electrode layer;
    a select device layer disposed on the bottom electrode layer;
    a middle electrode layer disposed on the select device layer;
    a phase-change material layer disposed on the middle electrode layer; a top electrode layer disposed on the phase-change material layer; and
    a barrier film comprising a group IV transition metal having up to 15% by atom, a group VI transition metal having up to 70% by atom, carbon (C) having 5%-90% by atom and nitrogen (N) having 20%-30% by atom, the barrier film being disposed between the bottom electrode layer and the top electrode layer, wherein the barrier film has a resistance ranging from 1 mOhm-cm to 50 mOhm-cm, and wherein the top and bottom electrode layers have a resistance ranging from 1 mOhm-cm to 100 mOhm-cm.

2. The apparatus of claim 1, wherein
    the group IV transition metal comprises titanium (Ti); and
    the group VI transition metal comprises tungsten (W).

3. The apparatus of claim 2, wherein the barrier film comprises up to 15% by atom of Ti and from 20% to 35% by atom of W.

4. The apparatus of claim 1, wherein
    the bottom electrode layer, the middle electrode layer and the top electrode layer comprise carbon; and
    the select device layer and the phase-change material layer comprise a chalcogenide material.

5. The apparatus of claim 1, wherein the barrier film is disposed at an interface between the bottom electrode layer and the select device layer.

6. The apparatus of claim 1, wherein the barrier film is disposed at an interface between the select device layer and the middle electrode.

7. The apparatus of claim 1, wherein the barrier film is disposed at an interface between the middle electrode layer and the phase-change material layer.

8. The apparatus of claim 1, wherein the barrier film is disposed at an interface between the phase-change material layer and the top electrode layer.

9. The apparatus of claim 1, wherein the barrier film is a first barrier film disposed at an interface between the bottom electrode layer and the select device layer, the apparatus further comprising:
    a second barrier film disposed at an interface between the select device layer and the middle electrode layer, the second barrier film comprising the group IV transition metal, the group VI transition metal, carbon (C) and nitrogen (N).

10. The apparatus of claim 1, wherein the barrier film is a first barrier film disposed at an interface between the middle electrode layer and the phase-change material layer, the apparatus further comprising:

a second barrier film disposed at an interface between the phase-change material layer and the top electrode layer, the second barrier film comprising the group IV transition metal, the group VI transition metal, carbon (C) and nitrogen (N).

11. The apparatus of claim 1, wherein the barrier film is a first barrier film disposed at an interface between the bottom electrode layer and the select device layer, the apparatus further comprising:
a second barrier film disposed at an interface between the select device layer and the middle electrode layer, the second barrier film comprising the group IV transition metal, the group VI transition metal, carbon (C) and nitrogen (N);
a third barrier film disposed at an interface between the middle electrode layer and the phase-change material layer, the third barrier film comprising the group IV transition metal, the group VI transition metal, carbon (C) and nitrogen (N); and
a fourth barrier film disposed at an interface between the phase-change material layer and the top electrode layer, the fourth barrier film comprising the group IV transition metal, the group VI transition metal, carbon (C) and nitrogen (N).

12. A method comprising: providing a substrate; and forming a plurality of phase-change memory (PCM) elements, wherein individual PCM elements of the plurality of PCM elements include:
a bottom electrode layer;
a select device layer disposed on the bottom electrode layer;
a middle electrode layer disposed on the select device layer;
a phase-change material layer disposed on the middle electrode layer;
a top electrode layer disposed on the phase-change material layer; and
a barrier film comprising a group IV transition metal having up to 15% by atom, a group VI transition metal having up to 70% by atom, carbon (C) having 5%-90% by atom and nitrogen (N) having 20%-30% by atom, the barrier film being disposed between the bottom electrode layer and the top electrode layer, wherein the barrier film has a resistance ranging from 1 mOhm-cm to 50 mOhm-cm, and wherein the top and bottom electrode layers have a resistance ranging from 1 mOhm-cm to 100 mOhm-cm.

13. The method of claim 12, wherein forming the plurality of PCM elements comprises:
depositing the bottom electrode layer on a word-line disposed on the substrate;
depositing the select device layer on the bottom electrode layer;
depositing the middle electrode layer on the select device layer;
depositing the phase-change material layer on the middle electrode layer;
depositing the top electrode layer on the phase-change material layer; and
depositing the barrier film on one of the bottom electrode layer, the select device layer, the middle electrode layer, the phase-change material layer, and the top electrode layer.

14. The method of claim 13, wherein depositing the barrier film is performed by physical vapor deposition (PVD) or atomic layer deposition (ALD).

15. The method of claim 13, wherein:
the group IV transition metal comprises titanium (Ti); and
the group VI transition metal comprises tungsten (W).

16. The method of claim 15, wherein the barrier film comprises up to 15% by atom of Ti and from 20% to 35% by atom of W.

17. A system comprising:
a circuit board; and
a die coupled with the circuit board, the die comprising:
a plurality of phase-change memory (PCM) elements, wherein individual PCM elements of the plurality of PCM elements include:
a bottom electrode layer;
a select device layer disposed on the bottom electrode layer;
a middle electrode layer disposed on the select device layer;
a phase-change material layer disposed on the middle electrode layer;
a top electrode layer disposed on the phase-change material layer; and
a barrier film comprising a group IV transition metal having up to 15% by atom, a group VI transition metal having up to 70% by atom, carbon (C) having 5%-90% by atom and nitrogen (N) having 20%-30% by atom, the barrier film being disposed between the bottom electrode layer and the top electrode layer, wherein the barrier film has a resistance ranging from 1 mOhm-cm to 50 mOhm-cm, and wherein the top and bottom electrode layers have a resistance ranging from 1 mOhm-cm to 100 mOhm-cm.

18. The system of claim 17, wherein
the group IV transition metal comprises titanium (Ti); and
the group VI transition metal comprises tungsten (W).

19. The system of claim 17, wherein
the bottom electrode layer, the middle electrode layer and the top electrode layer comprise carbon; and
the select device layer and the phase-change material layer comprise a chalcogenide material.

20. The system of claim 17, wherein the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *